(12) United States Patent
Voser et al.

(10) Patent No.: US 9,214,589 B2
(45) Date of Patent: Dec. 15, 2015

(54) METHOD OF INLINE MANUFACTURING A SOLAR CELL PANEL

(75) Inventors: Stephan Voser, Grabs (CH); Oliver Rattunde, Werdenberg (CH); Martin Dubs, Maienfeld (CH); Gerald Feistritzer, Bregenz (AT); Volker Wuestenhagen, Feldkirch (AT); Gerhard Dovids, Maienfeld (CH)

(73) Assignee: OERLIKON ADVANCED TECHNOLOGIES AG, Balzers (LI)

( * ) Notice: Subject to any disclaimer, the term of this patent is extended or adjusted under 35 U.S.C. 154(b) by 0 days.

(21) Appl. No.: 13/256,979

(22) PCT Filed: Mar. 15, 2010

(86) PCT No.: PCT/EP2010/053273
§ 371 (c)(1),
(2), (4) Date: Sep. 16, 2011

(87) PCT Pub. No.: WO2010/106012
PCT Pub. Date: Sep. 23, 2010

(65) Prior Publication Data
US 2012/0009730 A1    Jan. 12, 2012

Related U.S. Application Data

(60) Provisional application No. 61/161,084, filed on Mar. 18, 2009, provisional application No. 61/163,939, filed on Mar. 27, 2009.

(51) Int. Cl.
*H01L 31/18* (2006.01)
*H01L 21/67* (2006.01)

(52) U.S. Cl.
CPC .......... *H01L 31/18* (2013.01); *H01L 21/67173* (2013.01); *H01L 21/67196* (2013.01); *H01L 21/67201* (2013.01); *H01L 21/67207* (2013.01)

(58) Field of Classification Search
CPC ................ H01L 31/18; H01L 21/3185; H01L 21/67173; H01L 21/67748; H01L 21/67739; C23C 16/345
USPC ............... 136/243; 438/48, 98; 257/E31.001, 257/E31.11, E31.124
See application file for complete search history.

(56) References Cited

U.S. PATENT DOCUMENTS

| | | | |
|---|---|---|---|
| 2004/0107020 A1* | 6/2004 | Yokoyama et al. | 700/121 |
| 2005/0158891 A1* | 7/2005 | Barth et al. | 438/22 |

(Continued)

FOREIGN PATENT DOCUMENTS

| | | |
|---|---|---|
| WO | 2007/129838 A1 | 11/2007 |
| WO | 2009/030374 A1 | 3/2009 |

OTHER PUBLICATIONS

International Search Report for PCT/EP2010/053273 dated Apr. 12, 2011.

(Continued)

*Primary Examiner* — Kimberly Rizkallah
*Assistant Examiner* — Mounir Amer
(74) *Attorney, Agent, or Firm* — Pearne & Gordon LLP (57) ABSTRACT

Throughput of manufacturing thin-film solar panels by inline technique is made substantially independent from the time extent of different surface treatment steps by accordingly subdividing treatment steps in sub-steps performed in inline subsequent treatment stations. Treatment duration in each of the subsequent treatment stations is equal($\tau$).

23 Claims, 5 Drawing Sheets

(56) References Cited

U.S. PATENT DOCUMENTS

| | | |
|---|---|---|
| 2006/0182533 A1* | 8/2006 | Ogi .................................. 414/217 |
| 2007/0017445 A1* | 1/2007 | Takehara et al. ............... 118/719 |
| 2007/0184636 A1* | 8/2007 | Takano ........................... 438/476 |
| 2007/0254112 A1* | 11/2007 | Takehara et al. ............... 427/569 |
| 2007/0281090 A1* | 12/2007 | Kurita et al. ................. 427/255.7 |
| 2008/0019809 A1* | 1/2008 | Takano ..................... 414/222.01 |
| 2008/0190659 A1* | 8/2008 | Brody et al. .................... 174/264 |
| 2008/0213477 A1* | 9/2008 | Zindel et al. ................ 427/255.28 |
| 2008/0251116 A1* | 10/2008 | Green ........................... 136/255 |
| 2008/0271675 A1* | 11/2008 | Choi et al. ..................... 118/715 |
| 2008/0302653 A1 | 12/2008 | Trassl et al. |
| 2009/0004850 A1* | 1/2009 | Ganguli et al. ................ 438/655 |
| 2009/0022908 A1* | 1/2009 | Yang et al. .................... 427/579 |
| 2009/0061627 A1* | 3/2009 | Trassl et al. .................... 438/674 |
| 2009/0104732 A1* | 4/2009 | White ............................. 438/96 |
| 2009/0197015 A1* | 8/2009 | Kudela et al. .................. 427/569 |
| 2010/0252532 A1* | 10/2010 | Ishizawa et al. ................ 216/67 |

OTHER PUBLICATIONS

Written Opinion for PCT/EP2010/053273 dated Apr. 12, 2011.

* cited by examiner

METHOD OF INLINE MANUFACTURING A SOLAR CELL PANEL

The present invention is directed on a method of inline manufacturing a solar cell panel in thin-film technique.

For manufacturing solar cell panels in thin film technology a multitude of distinct surface treatment steps, including steps of layer deposition on surfaces, are to be performed in a consecutive manner. In inline processing or manufacturing at least a part of the addressed treatment steps are performed by consecutive treatments performed in subsequent treatment stations.

We thereby understand under the term "consecutive" events, especially the addressed treatment steps, executed one after the other in time.

We understand under the term "subsequent treatment stations" such stations locally arranged in a chain, the output of one station being fed to the input of a subsequent station in the chain.

"Inline" manufacturing comprises treatments performed in "subsequent treatment stations".

The treatment steps performed generically in thin-film solar cell manufacturing, including inline manufacturing, are often of highly different duration. Thereby, the processing step with the longest duration establishes for the overall throughput of the inline manufacturing process, acting as the bottleneck process.

It is an object of the present invention to provide for an improved inline manufacturing method as addressed above.

The method of inline manufacturing a solar cell panel according to the present invention includes treating surfaces by consecutive treatments of different durations and comprises establishing a basic treatment step duration. Each of the addressed consecutive treatments of different duration is performed in a respective number of subsequent treatment stations. Treatments in all of the addressed subsequent treatment stations for the respective consecutive treatments have a duration equal to the duration of the basic step.

Thereby, the treatment steps performed in all subsequent treatment stations are of equal duration, according to the duration of the basic treatment step. Consecutive treatments of longer durations are split in sub-treatment steps, which are performed in a respective number of subsequent treatment stations. E.g. if a surface treatment necessitates a treatment time which accords with three times the basic step duration, the one substrate considered is treated in three subsequent treatment stations. Thereby, processing intensity in the subsequent treatment stations may be adapted so as to take into account the number of such stations for one surface processing and the duration of the basic step.

Throughput becomes governed by the basic treatment step duration and becomes independent from the duration of the surface treatments.

Due to the fact that consecutive treatments which last longer than the duration of the basic treatment step are performed in a number of subsequent treatment stations, if e.g. one of these multiple subsequent treatment stations is or must be disabled, the respective treatment may possibly be kept operative with a reduced number of subsequent treatment stations. Further, if one of the consecutive treatment steps necessitates, due to its extended duration, a multitude of subsequent treatment steps in respective subsequent treatment stations, this may be realized by looping the substrate e.g. twice or more times through the same subsequent treatment stations, thereby reducing the number of such treatment stations to be provided.

In one embodiment of the method according to the present invention the consecutive treatments comprise deposition of a layer of SiN:H by one of chemical vapour deposition or physical vapour deposition on a silicon wafer, by multiple subsequent treatment stations which are each, as was addressed, operated for the duration of the basic treatment step.

In a further embodiment of the method according to the present invention the consecutive treatments comprise deposition of a first layer of SiN:H in a first number of subsequent treatment stations and deposition on said first layer of a second layer of SiN in a second number of subsequent treatment stations. Thereby, in a preferred embodiment of the just addressed embodiment the second number is selected to be larger than the first number, preferably by a factor of 5.

Still in a further embodiment of the method according to the present invention the consecutive treatments comprise deposition of a first layer of SiN:H in a first number of subsequent treatment stations, thereon of a second layer of ZnS—$SiO_2$ in a second number of subsequent treatment stations and thereon of a third layer of $SiO_2$ in a third number of subsequent treatment stations. Thereby, the just addressed method is preferably performed by selecting the first and second numbers to be equal and, further preferably, by selecting the addressed third number to be larger than the first number, further preferably by a factor of 4.

In a further embodiment of the method according to the present invention the consecutive treatments comprise deposition of a layer of one of the following materials: Al, AlN, $Al_2O_3$, ITO, ITO: H, $CrO_2$, GeN, SiC, SiON, $SiO_2$, SiAlON, SiNiON, $TiO_2$, ZAO (Zinc-aluminum-oxide), $MgF_2$, ZNO, Ag, Au, AuSn, AuGe, Cu, Cr, Ni, NiV, Ti, a-Si, SiGe, ZnS, SiN:H, SiN.

Still in a further embodiment of the method according to the present invention the consecutive treatments comprise at least one of:

- single source PVD sputtering (PVD: physical vapour deposition, performed by DC- or Rf-discharge)
- multi-source PVD sputtering (co-sputtering of e.g. up to four different materials)
- PECVD (plasma-enhanced chemical vapour deposition)
- LEPCVD (low-energy plasma CVD)
- etching
- cooling
- degassing Still in a further embodiment of the method according to the present invention a substrate to be treated is looped more than one time through at least a part of the subsequent treatment stations.

In a further embodiment of the method according to the present invention the consecutive treatments comprise deposition of layers on both sides of a substrate.

Still in a further embodiment of the just addressed embodiment the layers are a first layer of one of SiN, SiC, $SiO_2$, a-Si and a second layer is of one of Al and of Ag.

Still in a further embodiment of the just addressed embodiment the first layer is deposited from SiN in a first number of subsequent treatment stations, the second layer is deposited of Al in a second number of subsequent treatment stations, whereby the second number is selected to be larger than the first number, preferably by a factor of 5.

As far as necessary the present invention will now further be exemplified with the help of figures. The figures show.

The figures show.

Figure 1:
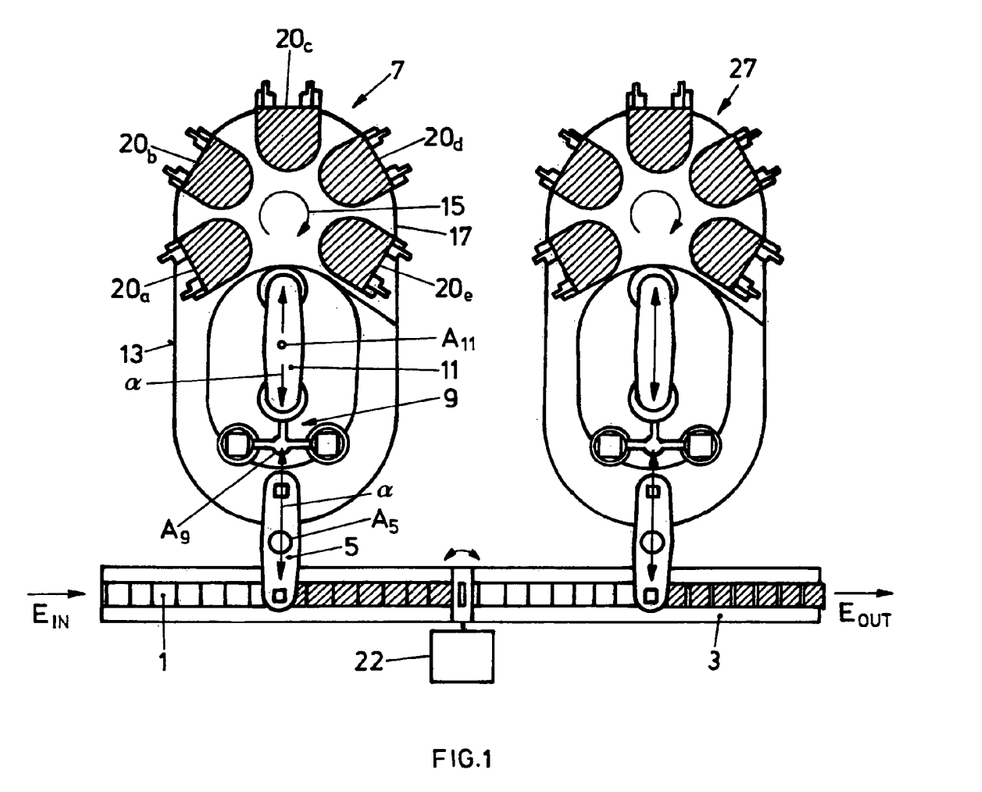
FIG. 1 schematically and in top view, a part of a manufacturing plant for inline manufacturing solar cell panels operated to perform the method according to the present invention.

FIG. 1 schematically shows, in a top view, a part of a manufacturing plant for inline manufacturing solar cell panels, which plant, as will be explained, may be operated to perform the method according to the invention. As shown by the input arrow $E_{in}$, solar panel substrates 1, e.g. with an extent of at least 200 mm×200 mm, are conveyed in a stepped manner along a linear conveyor 3. Along the transport path of linear conveyor 3 a substrate 1 is gripped by a first transport arrangement 5 swivelably driven about an axis $A_5$. The yet untreated substrate is transported towards a treatment facility 7. During standstill of conveyor 3 to allow gripping of a yet untreated substrate 1 by the transport arrangement 5, the transport arrangement 5 transports a treated substrate from treatment facility 7 onto that position on linear conveyor 3, which has just been freed from the yet untreated substrate 1. Thus, instead of an untreated substrate there is now present in the addressed location of linear conveyor 3 a substrate which has already been treated in facility 7. The addressed treated substrate has been gripped before by the transport arrangement 5 from a further transport arrangement 9 which is swivelable about axis $A_9$. Transport arrangement 9 is a four-armed transport arrangement. The place at the further transport arrangement 9 wherefrom the treated substrate has been gripped by transport arrangement 5 is exploited to deposit the yet untreated substrate from transport arrangement 5. The further transport arrangement 9 delivers a yet untreated substrate to a third transport arrangement 11 that is swivelably driven about an axis $A_{11}$ after having picked up from the addressed third transport arrangement 11, realized as a two-armed conveyor, a treated substrate. The third transport arrangement 11 delivers a yet untreated substrate via a loadlock arrangement 13 to a fourth transport arrangement 15 schematically shown by an arrow, after having removed a treated substrate from the addressed loadlock 13. The transport arrangement 15 which resides within a vacuum compartment 17 and transports, in a subsequent manner, as shown by the arrow, the substrates from one treatment station $20_a$ to $20_b$ etc., finally to the treatment station $20_e$, from which the treated substrate is handed over to transport arrangement 11 via loadlock 13 so as to be conveyed towards the linear conveyor 3.

Thus, the overall transport of substrates occurs bidirectionally as schematically shown by the double-arrows α towards and from the treatment facility 7. Therein, the substrates are conveyed by the transport arrangement 15 along a multitude of treatment stations as exemplified by $20_a$ to $20_e$ in an inline manner, i.e. in subsequent manner.

The linear conveyor 3 conveys, downstream of transport arrangement 5, substrates which have been treated by the facility 7. If necessary there is provided as shown schematically at 22 a turnover station, whereat the treated substrates arriving are turned over, so that their yet untreated back surface may be treated at a further treatment facility 27. Please note that in FIG. 1 treated substrate surfaces along conveyor 3 have been marked by hatching.

Figure 2:
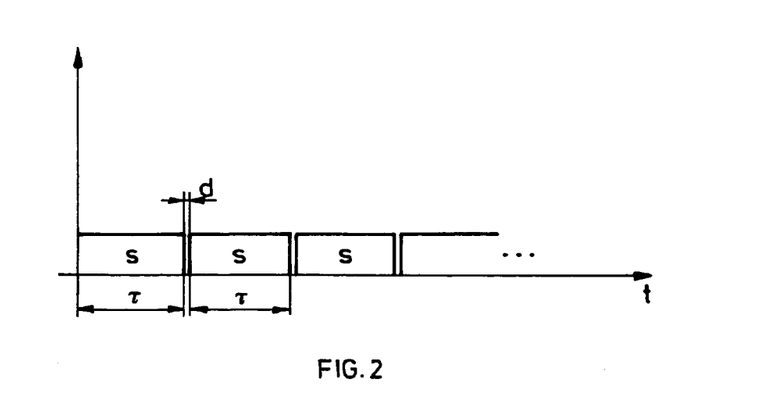
FIG. 2 along the time axis, a stepping diagram of the manufacturing plant according to FIG. 1.

The treatment in each of the treatment stations $20_a$ to $20_e$ as well as in the respective treatment stations of facility 27, if provided, lasts a time span τ. Thus and as schematically shown in FIG. 2, the overall plant shown in FIG. 1 is clocked to establish for respective time spans τ of standstill, with practically neglectable dynamic phases d to move the overall plant into subsequent positions. Thus and with an eye on FIG. 2 "s" represents the standstill time span of the overall plant, whereas the short time duration d represents that time span during which there is performed dynamically forwards stepping of conveyor 3, swivelling of transport arrangements 5, 9 and 11 as well as stepping forwards from one treatment station to the next by means of transport arrangement 15 within the vacuum compartment 17.

Figure 3:
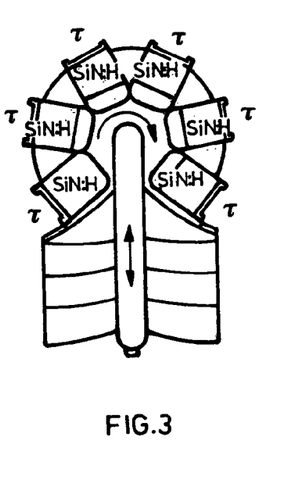
FIGS. 3-5 three different conceptions of subsequent treatment stations provided at treatment facilities of the plant as shown in FIG. 1.

In FIG. 3 there is schematically shown the treatment facility 7 as has been addressed in context with FIG. 1. In the respective treatment stations there are marked respective surface treatments as performed according to one embodiment of the present invention.

Thereby, there is deposited a thick layer of SiN:H upon the surface of a substrate. This is accomplished by performing the addressed surface treatment in six subsequent treatment stations, each performing deposition during the time span τ according to the basic treatment step duration. Thereby, the deposition of SiN:H in each of the six treatment stations may be performed e.g. by plasma enhanced CVD or by reactive PVD (as by sputtering).

Figure 7:
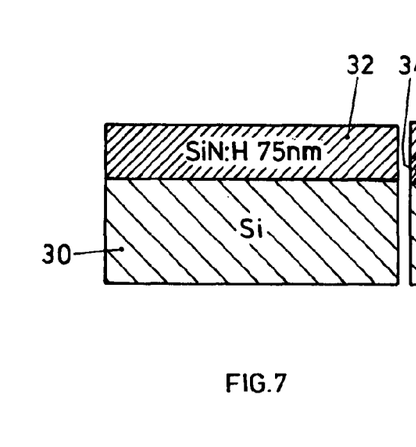

An example of treatment results of the treatment facility 7 of FIG. 3 is shown in FIG. 7. Upon a silicon-based substrate 30 there has been deposited a layer 32 of SiN:H with a thickness of 75 nm. This layer results from depositing at each of six subsequent treatment stations of treatment facility 7. In each of these stations a sub-layer of approx. 12.5 nm of SiN:H is deposited.

In context with solar cell panels it is of high importance that impinging solar light is most efficiently coupled into the silicon-based substrate, which—as perfectly known to the skilled artisan—comprises at least one n-i-p photovoltaically active structure. Thereby and so as to achieve this target it is common to prevent reflexion of solar light as it impinges on the first freely exposed surface of the solar panel and/or as it impinges on material interfaces between subsequent layers. With an eye on the embodiment of FIG. 7 manufactured with a conception of subsequent treatment stations as shown in FIG. 3, there is realized a first embodiment of an antireflex coating of SiN:H upon the silicon-based substrate 30.

Figure 12:
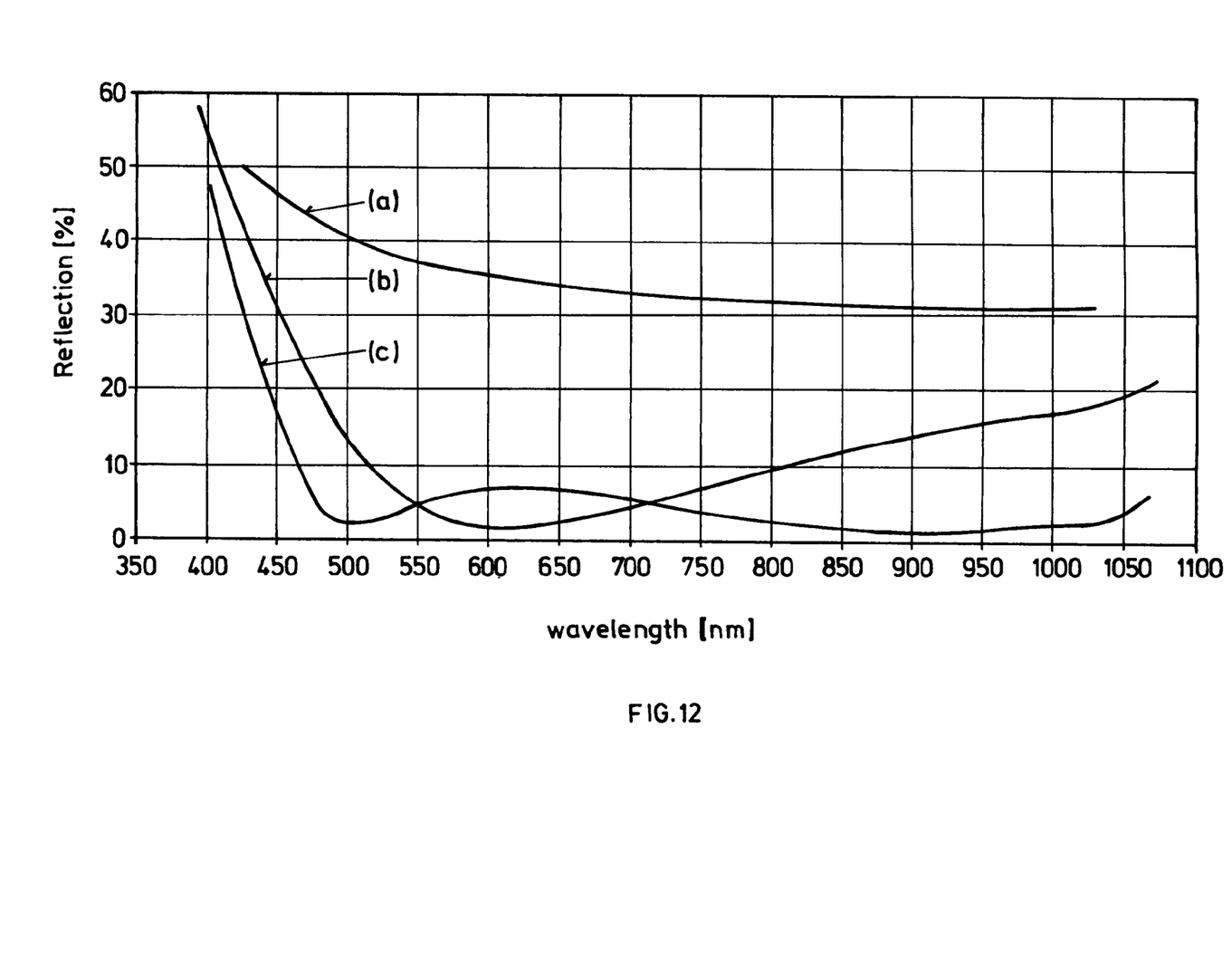
FIG. 12 reflexion spectra of silicon (a), of antireflex coating as shown in FIG. 7, (b), and of broadband antireflex coating as shown in FIG. 9, (c), and FIG. 13 for comparison purposes, reflexion as achieved on uncoated silicon, by the embodiment of FIG. 7 and by broadband antireflex embodiment of FIG. 9.

In FIG. 12 there is shown the spectrum (a) of reflection of silicon. The spectrum (b) is achieved with the embodiment of FIG. 7.

Figure 4:
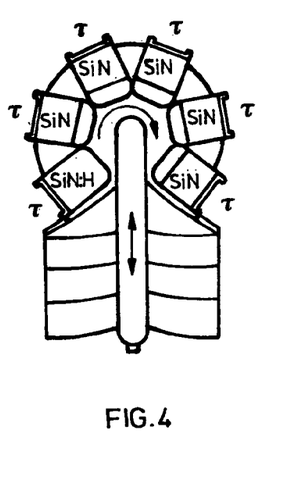

According to the embodiment of FIG. 4 consecutive treatment comprises first deposition of a relatively thin layer of SiN:H, followed by deposition of a relatively thick layer of SiN. Thereby, the first addressed of the consecutive treatments is performed in one single first treatment station, whereas deposition of the relatively thick layer, as the second of the consecutive treatment steps, is performed by depositing in each of the remaining five treatment stations. Again, the treatment duration in each of the six subsequent treatment stations is τ.

Thus, the thickness of the deposited SiN layer is approx. 5 times the thickness of the SiN:H layer.

Figure 8:
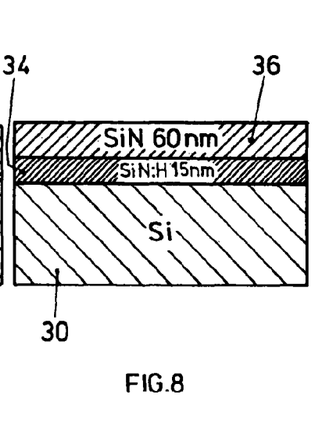
FIG. 8 a layer stack as results from manufacturing with conception of a treatment facility according to FIG. 4.

As an example, manufacturing with the treatment facility 7 conceived according to FIG. 4 results in a layer stack as shown in FIG. 8. A first layer 34 of SiN:H is deposited with a thickness of about 15 nm. This layer is deposited by the first of the six subsequent treatment stations. Upon the addressed layer 34 a layer of SiN is deposited with a thickness of about 60 nm. Therefrom, it might be seen that during the time span τ slightly more SiN:H is deposited than during the addressed time span τ in each of the five subsequent treatment stations for SiN.

The deposition rate in the subsequent treatment stations, on one hand for deposition of SiN:H and on the other hand for deposition of SiN, may be adjusted so as to result in respective layers with a desired thickness, taken the boundary condition of e.g. one station for SiN:H deposition and five stations for SiN deposition, and that all stations are operative during an equal time span τ.

With an eye the importance of minimizing solar light reflection as addressed above, so as to optimize efficiency of solar cell panels, the layer structure as shown in FIG. 8, as manufactured by an embodiment according to FIG. 4, is an improved antireflex coating stack of double-layer SiN:H/SiN. Thereby, in one embodiment thereof, there is established a gradient of H-content in the SiN:H layer resulting in an increasing H-concentration as propagating towards the Si substrate. This leads to the advantage that the tendency of film blistering due to lower film thickness is reduced.

Further, the SiN:H layer leads to a passivation of the silicon substrate surface, which is advantageous for an antireflex coating which is e.g. provided between the silicon-based substrate and a subsequent glass cover (not shown).

Figure 5:
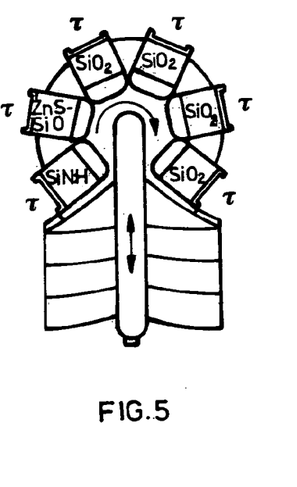

According to the embodiment of FIG. 5 first a relatively thin layer of SiN:H is deposited in one first of the subsequent treatment stations, then a layer of ZnS—SiO$_2$. The layer of ZnS—SiO$_2$ is relatively thick, thicker than the first deposited layer of SiN:H, although deposition of both layers being performed during the same time span τ. This is due to the higher deposition rate for ZnS—SiO$_2$ than for SiN:H.

Finally, a third layer of SiO$_2$ which is relatively thick is deposited in the remaining four subsequent treatment stations.

Figure 9:
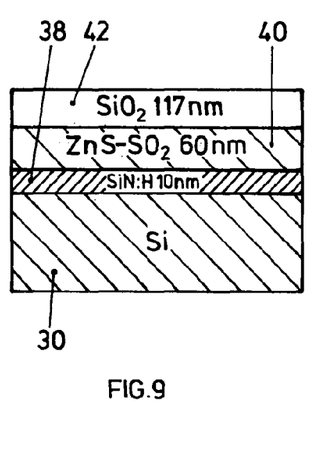
FIG. 9 a layer stack as results from manufacturing with a conception of a treatment facility according to FIG. 5.

A layer stack which results from manufacturing the solar cell panel with the treatment facility 7 conceived as shown in FIG. 5 is exemplified in FIG. 9. Thereby, on the silicon-based substrate 30 a first layer 38 of SiN:H is deposited during the time span τ with a thickness of 10 nm.

Subsequently, there is deposited a layer 40 of ZnS—SiO$_2$, again during time span τ and with a thickness of 60 nm. Finally, there is deposited in four sub-steps of a duration τ each a layer of SiO$_2$ of approx. 117 nm.

Here again, the respective deposition rates on one hand in the treatment station for SiN:H deposition, in the treatment station for ZnS—SiO$_2$ deposition and finally in the four subsequent treatment stations for deposition of SiO$_2$ may be respectively adjusted to cope with the boundary conditions of the respective numbers of treatment stations available on one hand and with the common treatment duration τ in all treatment stations.

Again with an eye on the comment with respect to minimizing solar light reflexion so as improve conversion efficiency of the photovoltaic process within a solar panel, the embodiment shown in FIG. 9 and manufactured by the conception shown in FIG. 5 is a broadband antireflex coating stack. Here again, the underlying SiN:H provides for surface passivation of the silicon surface. In FIG. 12 the spectrum (c) is shown as it results from the layer structure as shown in FIG. 9.

Clearly, one may further add e.g. a layer structure as a transparent conductive oxide layer structure e.g. of ITO, ITO:H upon the layer structure as shown in the FIGS. 7, 8 and 9. Thereby, there may be performed a partial TCO (Transparent Conductive Oxide) deposition with the help of shadowing masks for optimizing the trading off characteristics of conductivity and of transmission. Further, the addressed TCO may thereby be optimized for antireflex effect, for passivation and for electrically contacting the surface of the substrate. As an advantage a "gridless cell" or a "wider front-grid" may be realized, thereby increasing light trapping and increasing cell- and thus panel-efficiency.

Whenever there is formed a material interface between first material with the refractive index $n_1$ and second material with a refractive index of $n_2$ the resulting index of refraction n may be addressed by $$n = (n_1 \cdot n_2)^{1/2}$$

In the following table there are listed different single and double-layer structures with their respective material refractive index, film thicknesses and the resulting weighted reflexion. The refraction from a glass surface is thereby excluded.

| | Material | refractive index | film thickness [nm] | Weighted reflexion |
|---|---|---|---|---|
| single layer | SiN:H | 2.05 | 68 | 6.8% |
| single layer | ZnS | 2.25 | 62 | 5.0% |
| double layer | SiN:H + ZnS | 2.05 + 2.25 | 10 + 52 | 5.1% |

Figure 13:
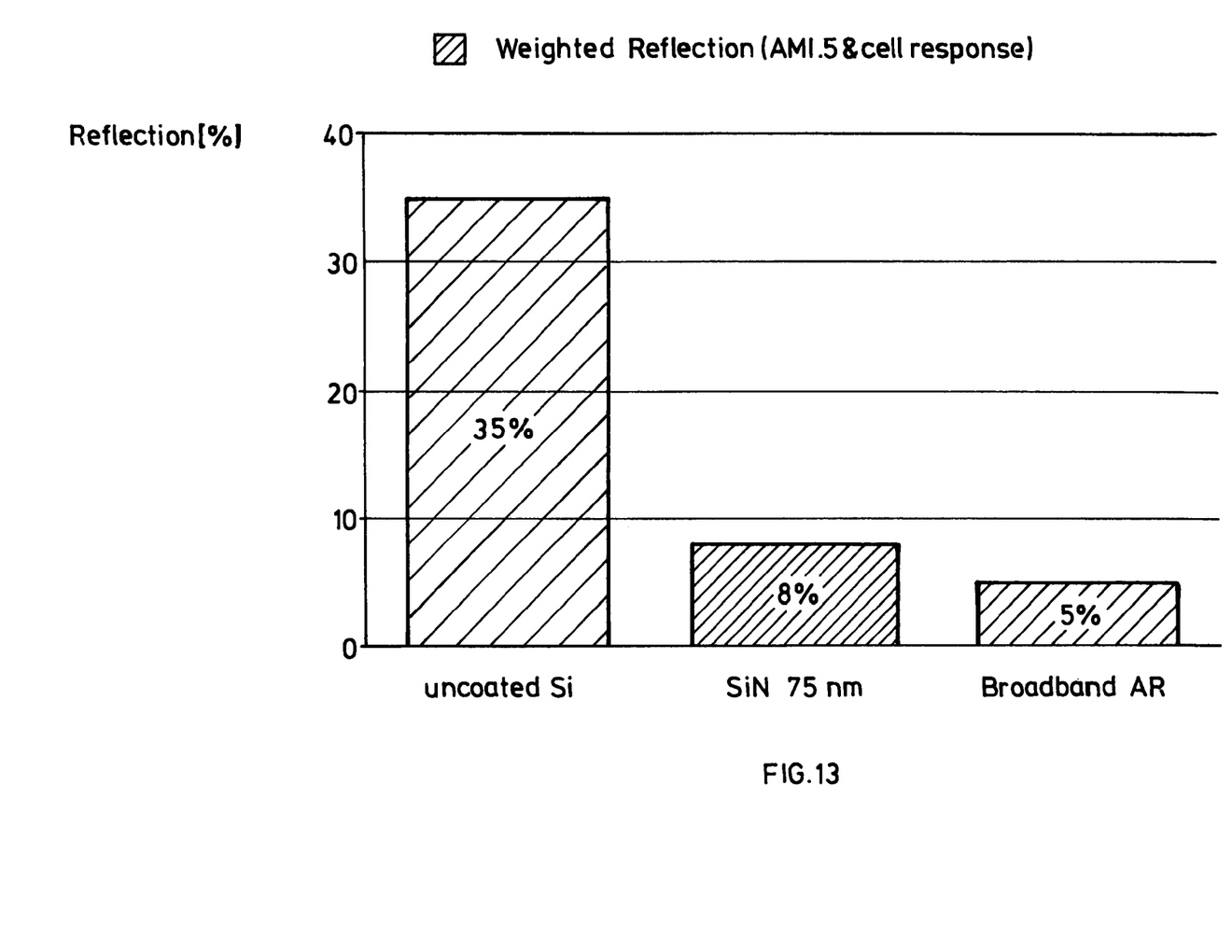

In FIG. 13 there is shown for comparison purposes the reflexion of an uncoated silicon surface, of an antireflexion coating as of FIG. 7 and of a broadband antireflexion coating system as shown in FIG. 9. To be noted is that by a reduction of reflected light from 8% to 5% the efficiency of the solar cell and thus of the panel is increased by about 0.5%.

Figure 10:
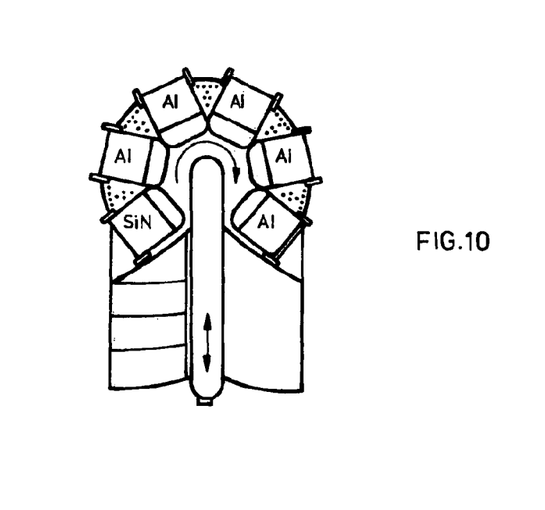
FIG. 10 in a representation in analogy to those of FIGS. 3-6, a further conception of the subsequent treatment stations in a facility as shown in FIG. 1.

In FIG. 10 there is shown in a representation in analogy to those of the FIGS. 3-5 an embodiment of the treatment facility 7 in which, in a first of the subsequent treatment stations, SiN is deposited and in the subsequent five treatment stations aluminum. With an eye on FIG. 1 the embodiment of the treatment facility 7 may accord with the treatment facility 27, whereat and with respect to previous treatments as performed with facility 7, the substrate has been turned over by turnover station 22 and thus the backside of the substrate is respectively treated. Instead of providing the first of the subsequent treatment stations as shown in FIG. 10 for SiN deposition, this treatment station may be conceived to deposit SiC or SiO$_2$. A respective layer stack on the backside of the silicon-based substrate 30 is shown in FIG. 11.

Figure 11:
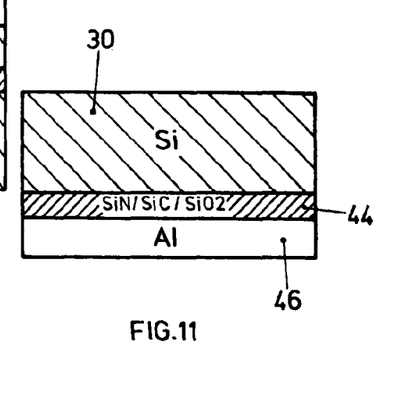
FIG. 11 a layer stack as results from the conception of a treatment facility as shown in FIG. 10.

The embodiment as shown in FIG. 11 manufactured by the conception as shown in FIG. 10 results in a combination of a dielectric film as of SiN, SiC, $SiO_2$, a-Si for backside reflexion with Al backside coating. The advantage gained thereby is multireflexion within the Si substrate, which leads to a total absorption of long-wavelength components of the solar light spectrum. Further, contacting the backside coating may be established by (partial) laser firing (LFCs-Laser Fired Contacts).

Thereby, as was addressed, subdividing the consecutive treatments in fact in sub-steps, which are performed subsequently in the respective subsequent treatment stations, is performed taking into consideration the respective treatment rates of the respectively performed treatments.

This approach, according to the invention, most flexibly allows to industrially manufacture layer stacks with a high diversity of layer materials and thicknesses.

Figure 6:
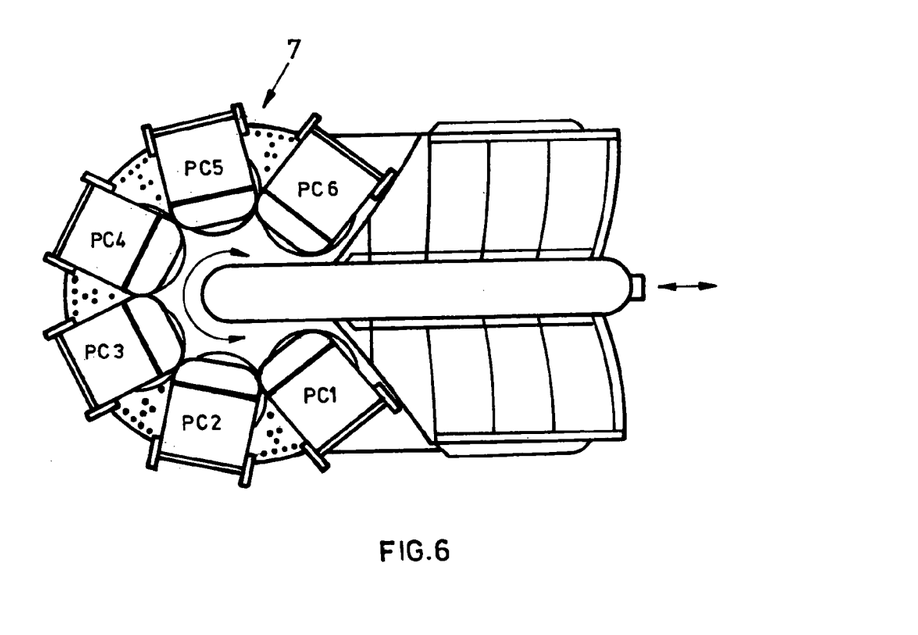
FIG. 6 in a representation in analogy to that of the FIGS. 3-5, more generalized conception of the respective subsequent treatment stations, FIG. 7 a layer stack as results from manufacturing with a conception of a treatment facility as shown in FIG. 3.

FIG. 6 again shows a treatment facility 7 as has been explained in context with FIG. 1 with six subsequent treatment stations, wherein, more generically, treatments PC1 to PC6 are performed in subsequent manner. The subsequent treatment stations, as an example 6 thereof as shown in FIG. 6, may be equipped with following modules:

CVD sputter module (physical vapour deposition; with DC-, pulsed D- or Rf-operated plasma discharge)
multi-source PVD modules (co-sputtering of e.g. up to four different materials)
PECVD modules (plasma-enhanced chemical vapour deposition)
LEPCVD modules (low-energy plasma CVD)
etching module (ICP (inductively coupled plasma)-Etch or MCIS (multi cell ion source) soft Etch)
heating module (including RTP-Rapid Thermal Processing module)
cooling module
degassing module Thereby, "Multiturn" control mode offers the possibility to cycle one and the same substrate several times through at least a part of the overall manufacturing plant prior to unloading, thereby using all or some of the addressed treatment stations for different steps in building up the layer stack.

Further, a wide range of different materials may be deposited by the addressed subsequent treatment stations, thereby especially:

Al, SiN, SiN:H (by DC and pulsed DC reactive sputtering, using reactive gases $N_2+H_2$, $NH_3$)
AlN, $Al_2O_3$, ITO, ITO:H, SiN, SiN:H (by pulsed DC sputtering using reactive gases as $N_2+H_2$, $NH_3$, $NH_4$, ZnO)
AlN, $Al_2O_3$, $CrO_2$, GeN, ITO, SiC, SiN, SiN:H, $SiO_2$, SiON, SiAlON, SiNiON, $TiO_2$, ZAO (as by pulsed DC sputtering)
$MgF_2$, ZnO, ZnS—$SiO_2$ (as by Rf sputtering)
Al, Ag, Au, AuSn, AuGe, Cu, Cr, Ni, NiV, Ti (as by DC sputtering)
a-Si (i,p,n), $Si_xGe_y$, $SiO_xN_y$ (as by PECVD or LEPCVD)

The invention claimed is:

1. A method of inline manufacturing a solar cell panel comprising:
defining consecutive distinct treatments of different durations for treating surfaces on a substrate,
establishing a basic treatment step duration,
dividing each of the consecutive distinct treatments in a number of sub-treatment portions, each sub-treatment portion having a duration equal to the basic treatment step duration, and
performing each sub-treatment portion in a separate treatment station.

2. The method of claim 1, said consecutive distinct treatments comprising deposition of a layer of one of the following materials: Al, AlN, $Al_2O_3$, ITO, ITO:H, $CrO_2$, GeN, SiC, SiON, $SiO_2$, SiAlON, SiNiON, $TiO_2$, ZAO (Zinc-aluminum-oxide), $MgF_2$, ZNO, Ag, Au, AuSn, AuGe, Cu, Cr, Ni, NiV, Ti, a-Si, SiGe, ZnS, SiN:H, and SiN.

3. The method of claim 1, wherein said consecutive distinct treatments comprise at least one of:
single-source PVD sputtering;
multisource PVD sputtering;
PECVD;
LEPCVD;
etching;
cooling; and
degassing.

4. The method of claim 1, said consecutive distinct treatments comprising deposition of layers on both sides of a substrate.

5. The method of claim 4, said layers being a first layer of one of SiN, SiC, $SiO_2$, and a-Si, and a second layer of one of Al and of Ag.

6. The method of claim 5, said first layer being deposited of SiN in a first number of subsequent treatment stations, said second layer is deposited of Al in a second number of subsequent treatment stations, wherein said second number is selected to be larger than said first number.

7. The method of claim 6, wherein said second number is selected to be larger than said first number by a factor of 5.

8. The method of claim 1, wherein the basic treatment step duration is a fraction of a longest duration of the different durations and at least one of said consecutive distinct treatments comprises at least two of said sub-treatment portions of said consecutive distinct treatments together.

9. The method of claim 1, further comprising the steps of transporting the substrate on a conveyor to treatment facilities each having several treatment stations for performing each sub-treatment portion of said consecutive distinct treatments; removing the substrate from the conveyor line at the treatment facilities for performing each sub-treatment portion of said consecutive distinct treatments at said several treatment stations.

10. The method according to claim 9 further comprising looping the substrate more than one time through at least a part of said treatment stations.

11. The method of claim 1, wherein similar sub-treatment portions of each of said consecutive distinct treatments of different durations are performed at more than one subsequent treatment station.

12. The method of claim 1, wherein a deposition of a subsequent layer of the same material is performed at more than one subsequent treatment station.

13. The method of claim 1, wherein a deposition of a subsequent layer of the same material with different thickness is performed at more than one subsequent treatment station.

14. A method of inline manufacturing a solar cell panel comprising:
treating surfaces by consecutive treatments of different durations,
establishing a basic treatment step duration, and
performing portions of each of said consecutive treatments of different duration in a respective number of subsequent treatment stations, treatment in each of said subsequent treatment stations for said portions of said consecutive treatments having a duration equal to said basic treatment step duration, said consecutive treatments of different durations comprising depositing a layer of SiN:H by one of CVD or PVD on a silicon wafer, by multiple subsequent treatment stations.

15. A method of inline manufacturing a solar cell panel comprising:

treating surfaces on a substrate by consecutive treatments of different durations, establishing a basic treatment step duration, performing portions of each of said consecutive treatments of different duration in a respective number of subsequent treatment stations, treatment in each of said subsequent treatment stations for said portions of said consecutive treatments of different durations having a duration equal to said basic treatment step duration, said consecutive treatments comprising deposition of a first layer of SiN:H in a first number of subsequent treatment stations and deposition on said first layer of a second layer of SiN in a second number of subsequent treatment stations.

16. The method of claim 15, said second number being selected to be larger than said first number.

17. The method of claim 16, wherein said second number is selected to be larger than said first number by a factor of 5.

18. A method of inline manufacturing a solar cell panel comprising:

treating surfaces on a substrate by consecutive treatments of different durations, establishing a basic treatment step duration, and performing portions of each of said consecutive treatments of different durations in a respective number of subsequent treatment stations, treatment in each of said subsequent treatment stations for said portions of said consecutive treatments having a duration equal to said basic treatment step duration, said consecutive treatments of different durations comprising deposition of a first layer of SiN:H in a first number of subsequent treatment stations, thereon of a second layer of ZnS—SiO$_2$ in a second number of subsequent treatment stations, thereon of a third layer of SiO$_2$ in a third number of subsequent treatment stations.

19. The method of claim 18, thereby selecting said first and second number to be equal.

20. The method of claim 18, thereby selecting said third number to be larger than said first number.

21. The method of claim 20, wherein said third number is selected to be larger than said first number by a factor of 4.

22. A method of inline manufacturing a solar cell panel comprising:

treating surfaces on a substrate by consecutive distinct treatments of different durations in separate treatment stations, establishing a basic treatment step duration, dividing each of the consecutive distinct treatments in a number of sub-treatment portions, each sub-treatment portion having a duration equal to the basic treatment step duration, and performing each sub-treatment portion of each of the consecutive distinct treatments of different durations in a different one of the separate treatment stations.

23. A method of inline manufacturing a solar cell panel comprising:

defining consecutive distinct treatments of different durations for treating surfaces on a substrate, establishing a basic treatment step duration, dividing each of the consecutive distinct treatments in a number of sub-treatment portions, each sub-treatment portion having a duration equal to the basic treatment step duration, and performing each sub-treatment in a separate treatment station, wherein each of the consecutive treatments of different durations consists of one of:

deposition of a layer of one of the following materials: Al, AlN, Al2O3, ITO, ITO:H, CrO2, GeN, SiC, SiON, SiO2, SiAlON, SiNiON, TiO2, ZAO (Zinc-aluminum-oxide), MgF2, ZNO, Ag, Au, AuSn, AuGe, Cu, Cr, Ni, NiV, Ti, a-Si, SiGe, ZnS, SiN:H, and SiN; or one of:

single-source PVD sputtering;

multisource PVD sputtering;

PECVD;

LEPCVD;

etching;

cooling; and degassing.

* * * * *

UNITED STATES PATENT AND TRADEMARK OFFICE
CERTIFICATE OF CORRECTION

PATENT NO. : 9,214,589 B2
APPLICATION NO. : 13/256979
DATED : December 15, 2015
INVENTOR(S) : Stephan Voser et al.

It is certified that error appears in the above-identified patent and that said Letters Patent is hereby corrected as shown below:

In the specification,

Column 2, line 3, please add - (CVD) - between "deposition" and "or".

Column 2, line 4, please add - (as of sputtering) - between "deposition" and "on".

Column 4, line 8, please change "αtowards" to - α towards -.

Column 5, line 65, please change "τeach" to - τ each -.

Signed and Sealed this
Thirty-first Day of May, 2016

Michelle K. Lee
*Director of the United States Patent and Trademark Office*